(12) United States Patent
Rabin et al.

(10) Patent No.: US 7,267,859 B1
(45) Date of Patent: Sep. 11, 2007

(54) THICK POROUS ANODIC ALUMINA FILMS AND NANOWIRE ARRAYS GROWN ON A SOLID SUBSTRATE

(75) Inventors: Oded Rabin, Cambridge, MA (US); Paul R. Herz, San Diego, CA (US); Mildred S. Dresselhaus, Arlington, MA (US); Akintunde I. Akinwande, Newton, MA (US); Yu-Ming Lin, White Plains, NY (US)

(73) Assignee: Massachusetts Institute of Technology, Cambridge, MA (US)

( * ) Notice: Subject to any disclaimer, the term of this patent is extended or adjusted under 35 U.S.C. 154(b) by 256 days.

(21) Appl. No.: 10/303,653

(22) Filed: Nov. 25, 2002

Related U.S. Application Data

(60) Provisional application No. 60/333,403, filed on Nov. 26, 2001.

(51) Int. Cl.
- B32B 3/10 (2006.01)
- B32B 9/00 (2006.01)
- B32B 15/00 (2006.01)
- G03C 5/00 (2006.01)
- C23C 28/00 (2006.01)

(52) U.S. Cl. .............. 428/131; 428/472.2; 428/614; 428/629; 430/312; 430/314; 430/318; 205/198; 205/212

(58) Field of Classification Search ............ 428/131, 428/472.2, 606, 614, 629; 430/312, 314, 430/318; 205/198, 212, 260
See application file for complete search history.

(56) References Cited

U.S. PATENT DOCUMENTS 3,886,578 A * 5/1975 Eastwood et al. ............ 257/43

(Continued)

FOREIGN PATENT DOCUMENTS

WO WO99/08785 2/1999

OTHER PUBLICATIONS

Patent Abstract of Japan, Application No. 11118954, vol. 2000, No. 14, Mar. 5, 2001, 1 Page.
International Search Report for PCT/US02/37732.
Oded Rabin et al., "Nanofabrication Using Self-Assembled Alumina Templates", Materials Research Society, Jan. 2001, vol. 636, 6 pages.

(Continued)

*Primary Examiner*—Patricia L. Nordmeyer
(74) *Attorney, Agent, or Firm*—Daly, Crowley, Mofford Durkee, LLP

(57) ABSTRACT

The presently disclosed invention provides for the fabrication of porous anodic alumina (PAA) films on a wide variety of substrates. The substrate comprises a wafer layer and may further include an adhesion layer deposited on the wafer layer. An anodic alumina template is formed on the substrate. When a rigid substrate such as Si is used, the resulting anodic alumina film is more tractable, easily grown on extensive areas in a uniform manner, and manipulated without danger of cracking. The substrate can be manipulated to obtain free-standing alumina templates of high optical quality and substantially flat surfaces PAA films can also be grown this way on patterned and non-planar surfaces. Furthermore, under certain conditions the resulting PAA is missing the barrier layer (partially or completely) and the bottom of the pores can be readily accessed electrically. The resultant film can be used as a template for forming an array of nanowires wherein the nanowires are deposited electrochemically into the pores of the template. By patterning the electrically conducting adhesion layer, pores in different areas of the template can be addressed independently, and can be filled electrochemically by different materials. Single-stage and multi-stage nanowire-based thermoelectric devices, consisting of both n-type and p-type nanowires, can be assembled on a silicon substrate by this method.

49 Claims, 8 Drawing Sheets

U.S. PATENT DOCUMENTS

| | | |
|---|---|---|
| 5,581,091 A | 12/1996 | Moskovits et al. |
| 5,747,180 A | 5/1998 | Miller et al. |
| 6,129,901 A | 10/2000 | Moskovits et al. |
| 6,159,831 A | 12/2000 | Thrush et al. |
| 6,231,744 B1 | 5/2001 | Ying et al. |
| 6,359,288 B1 * | 3/2002 | Ying et al. ............ 257/14 |
| 6,440,637 B1 * | 8/2002 | Choi et al. ............ 430/296 |
| 6,525,461 B1 * | 2/2003 | Iwasaki et al. ......... 313/495 |
| 2003/0010971 A1 | 1/2003 | Zhang et al. |

OTHER PUBLICATIONS

D. Crouse et al., "Self-Ordered Pore Structure of Anodized Aluminum on Silicon and Pattern Transfer", Applied Physics Letters, Jan. 2000, vol. 78, No. 1, pp. 49-51.

Y. Li et al., "Synthesis of High Density Arrays of Nanoscaled Gridded Field Emitters Based on Anodic Alumina", American Vacuum Society, Mar./Apr. 2000, pp. 994-996.

Wu Jun-Hui et al., "Preparation of Si Nanocrystals Using Anodic Porous Alumina Template Formed on Silicon Substrate", National Laboratory of Solid State Microstructures and Department of Physics, Nanjing University, Oct. 1999. vol. 17, No. 6, p. 451.

* cited by examiner

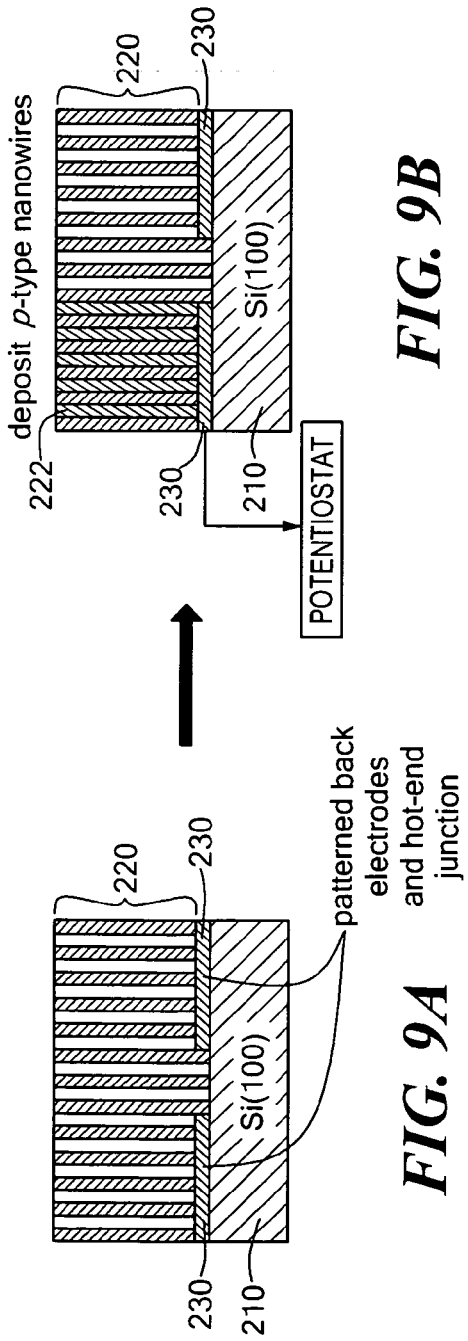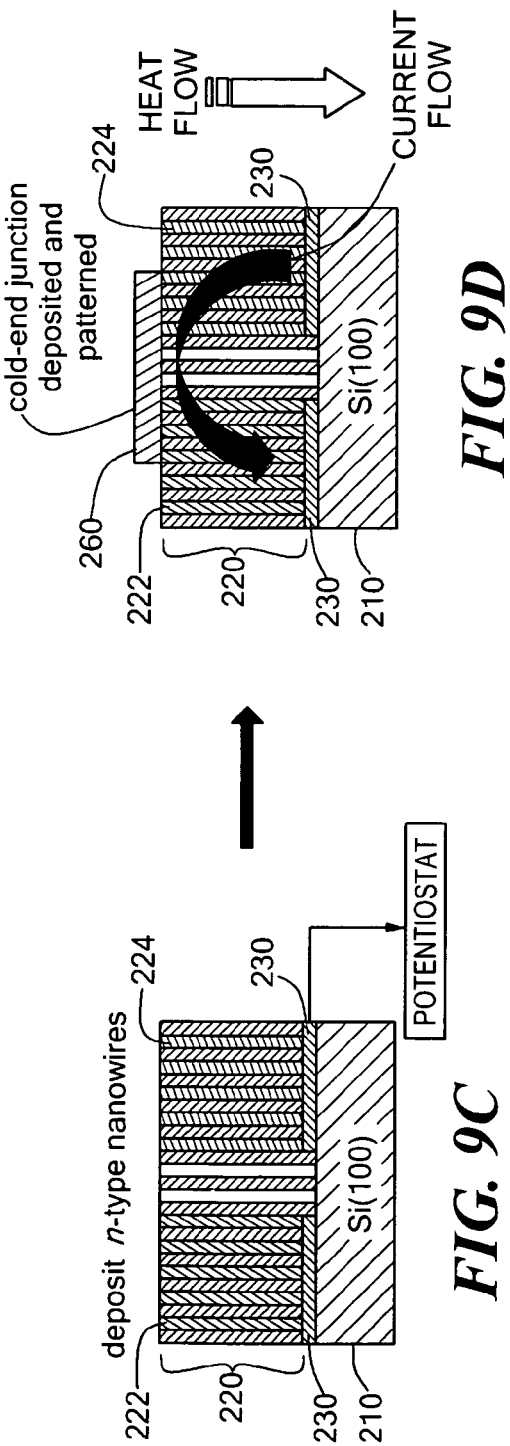

THICK POROUS ANODIC ALUMINA FILMS AND NANOWIRE ARRAYS GROWN ON A SOLID SUBSTRATE

RELATED APPLICATIONS

This application claims priority under 35 U.S.C. § 119(e) to provisional patent application Ser. No. 60/333,403 filed Nov. 26, 2001; the disclosure of which is incorporated by reference herein.

GOVERNMENT RIGHTS

This invention was made with Government support under Contract No. 0205-G-BB853, awarded by MURI/ONR/ UCLA, Contract No. N00167-98-K-0024 awarded by the Department of the Navy, Contract No. N00014-96-1-0802 awarded by the Department of the Navy and DARPA, Subcontract No 0205-G-7A114 awarded by MURI, and Grant No DMR-98-04734 awarded by NSF. The Government has certain rights in this invention.

FIELD OF THE INVENTION

The present invention relates generally to porous anodic alumina films and more specifically to a method and apparatus incorporating porous anodic alumina films as a template for the fabrication of nanostructured devices.

BACKGROUND OF THE INVENTION

Porous anodic alumina (PAA) films are films generated by electrochemical oxidation of aluminum under selective conditions (electrolyte, temperature and voltage). These films have a unique morphology of a honeycomb array of channels, several nanometers in diameter and several microns in length, which are perpendicular to the surface of the film. At the alumina-aluminum interface however there is a non-porous undulated alumina barrier layer several nanometers thick Since the pore size, the pore length, the inter-pore distance, and the barrier layer thickness can all be controlled by the anodization conditions, PAA films have attracted a lot of interest as a nanotechnology tool. PAA films have found applications as filters, collimators, as templates for nano-patterning and nanowire growth, and as photonic bandgap materials PAA films have several disadvantages associated with them. These disadvantages have precluded the use of PAA films in a wider range of applications. Free-standing anodic films are extremely fragile and cannot sustain stress. Even when the film is attached to the aluminum substrate, the film may fracture since aluminum is a soft metal Such uniform, small-feature and controllable porous structures have being successfully grown only on aluminum, and not on any other substrate. The growing porous film is separated from the underlying metallic aluminum by a scalloped layer of oxide, known as the barrier layer. The barrier layer prevents electrical contact to be established with the bottoms of the pores of the film.

The conventional way of fabricating the PAA films starts with an aluminum sheet that goes through several steps of mechanical and electrochemical polishing. Once the surface roughness of the sheet is down to the sub-micron level, the metal is anodized in an acidic bath and the porous alumina is obtained The quality of the starting anodic alumina is usually low in terms of the ordering and uniformity of the pores. Therefore, this initial film is typically etched away and a new PAA film is grown under the same or similar anodization conditions. The pores cannot be provided all the way through the aluminum, since an electrical path through the aluminum is necessary to perform the anodization, and the aluminum substrate functions as an electrode for the anodization process In order to obtain a PAA membrane in which the pores run completely through the film and are open (and accessible) on both sides, it is necessary to etch away the metallic aluminum sustaining the oxide and subsequently also to etch away the barrier layer, or to detach the membrane from the aluminum substrate by one of the available methods to do so.

In practice, this process has several disadvantages associated with it. The mechanical polishing steps introduce imperfections and contamination, limit the active area of the film, and limit the throughput of the process. Another disadvantage with the prior art process is that after the removal of the sustaining metal, the free-standing PAA film is very brittle and is hard to manipulate effectively. Further, during the etch steps the surface topography of the film is degraded thereby affecting the optical properties of the film and its use as a mask.

It would, therefore, be desirable to provide a method which allows for the fabrication of PAA films on a wide variety of substrates. When a rigid substrate is used, the resulting anodic film is more tractable, easily grown on extensive areas in a uniform manner, and can be manipulated without danger of fracturing. It would be further desirable to provide the film on patterned and non-planar surfaces. It would still further be desirable to provide the PAA film missing the barrier layer (partially or completely) such that the bottom of the pores can be readily accessed electrically such as by a conducting layer on the substrate. Having such a film, an array of nanowires perpendicular to the surface of the film can be deposited into the pores.

It would be further desirable to provide the PAA film on a patterned conducting layer such that the resulting anodic film can be provided with one set of pores filled with one type of nanowire material (e.g. n-type material) and another set of pores provided with a different nanowire material (e.g. p-type). It would be further desirable to provide the PAA film missing the barrier layer on a patterned conducting layer such that pores, or nanowires within the pores, can be electrically addressed independently from each other. It would further be desirable to provide the PAA templates such that multiple stages of the templates can be built, and can be stacked to form a multi-stage device.

SUMMARY OF THE INVENTION

The present new technology described herein allows for the fabrication of PAA films on a wide variety of substrates. The substrate comprises a wafer layer and may further include an adhesion layer deposited on the wafer layer. An alumina template is formed on the substrate. When a rigid substrate such as a conventional silicon wafer is used, the resulting anodic film is more tractable, easily grown on extensive areas in a uniform manner, and manipulated without danger of cracking. PAA films can also be grown this way on patterned and non-planar surfaces. Furthermore, under certain conditions the resulting PAA is missing the barrier layer (partially or completely) and the bottom of the pores can be readily accessed electrically The resultant film can be used as a template for forming an array of nanowires wherein the nanowires are prepared by filling the pores of the template by a different material The nanowires may be formed from various materials within the same template Arrays of nanowires may be stacked on top of each other into a multi-stage architecture.

BRIEF DESCRIPTION OF THE DRAWINGS

The invention will be more fully understood from the following detailed description taken in conjunction with the accompanying drawings, in which:

FIG. 9A is a diagram showing the first stage of fabrication of a multicomponent nanowire array;

FIG. 9B is a diagram showing the second stage of fabrication of a multicomponent nanowire array;

FIG. 9C is a diagram showing the third stage of fabrication of a multicomponent nanowire array;

FIG. 9D is a diagram showing the fourth stage of fabrication of a multicomponent nanowire array;

DETAILED DESCRIPTION OF THE INVENTION

Porous anodic alumina (PAA) has received considerable attention as a template for the fabrication of nanostructures. The ordered triangular array of pores of high aspect ratio, whose dimensions can be accurately tuned by the process parameters, has made PAA a suitable host for the fabrication of nanowires of a wide range of materials. Applications of these arrays of nanowires include dense magnetic storage devices, field emission devices, thermoelectric devices, photovoltaic devices, nano-electrodes, sensing devices, photonic components and the study of low-dimensional quantum effects. Several researchers have used PAA as a mask for etching or deposition processes.

More recently, it was found that the optical properties of alumina together with the proper positioning of the voids in the film result in a 2-dimensional photonic crystal with a bandgap which can be controlled in the wavelength range of 520-600 nm (for certain polarizations and propagation directions of the light).

Figure 1:
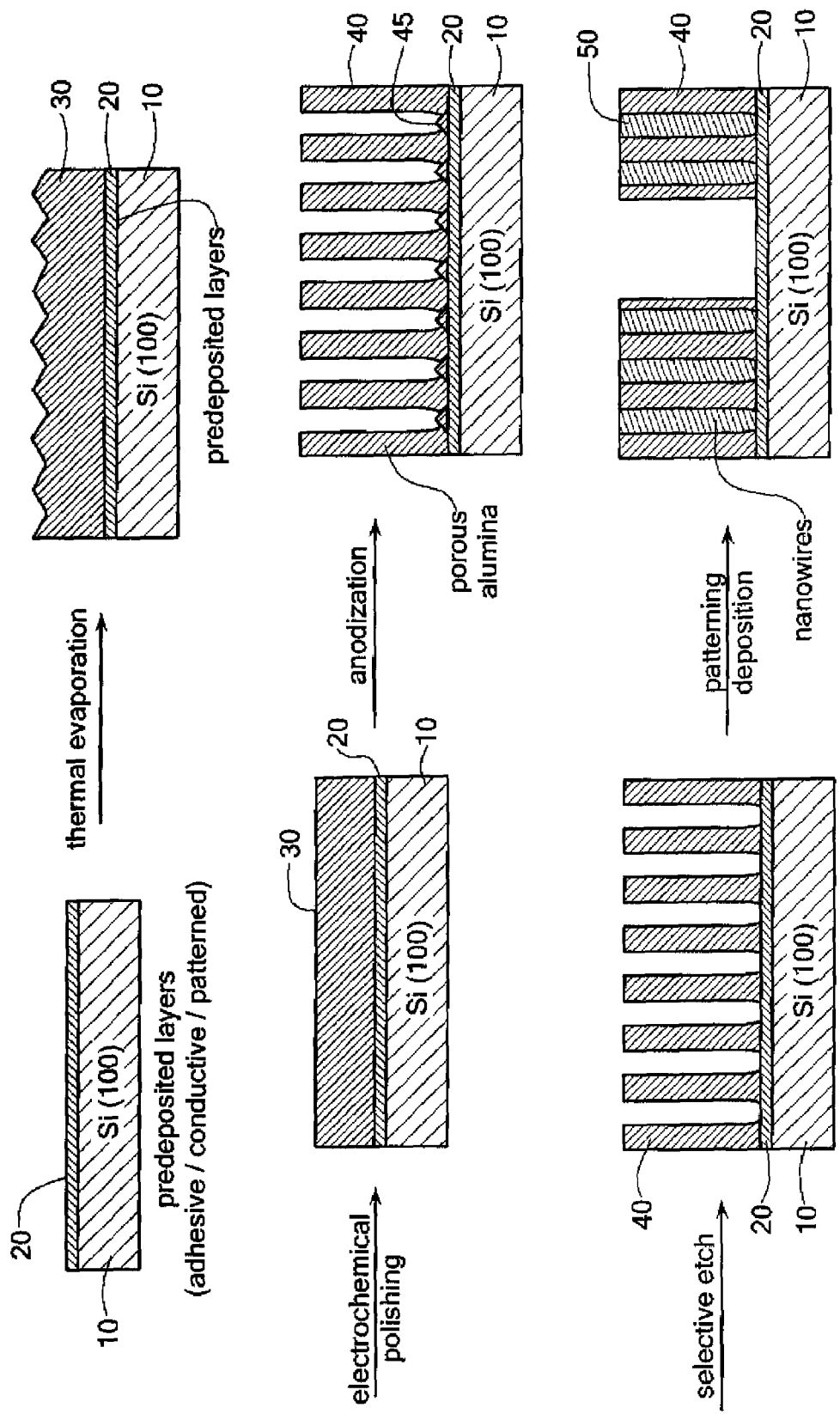
FIG. 1 is a schematic illustration of the presently disclosed process for fabricating a PAA film.
Figure 2:
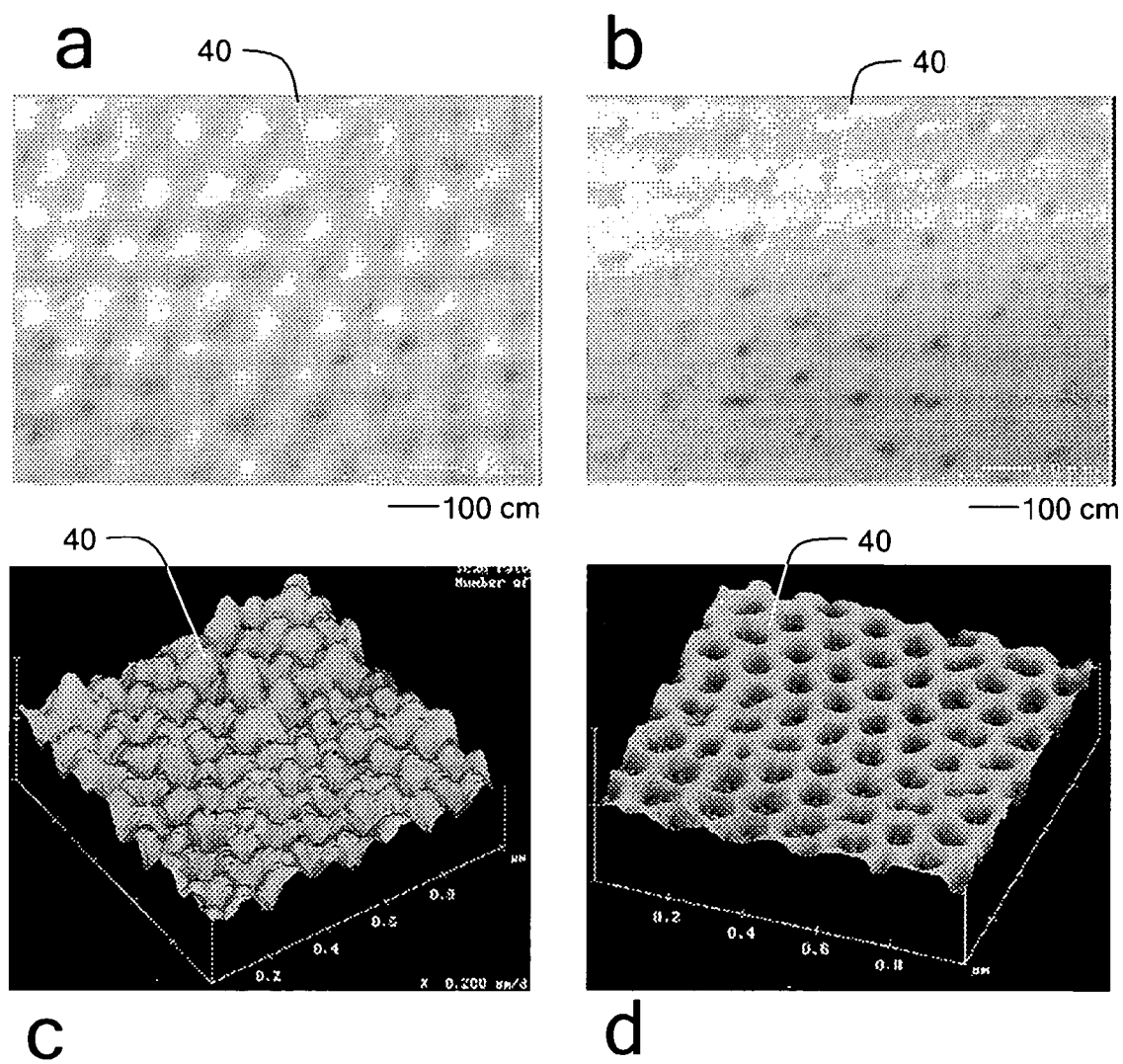
FIG. 2A is a SEM micrograph of a top surface of a PAA film formed by the presently disclosed method.
FIG. 2B is a SEM micrograph of a bottom surface of the PAA film of FIG. 2A.
FIG. 2C is an AFM micrograph of a top surface of a PAA film of FIG. 2A.
FIG. 2D is an AFM micrograph of a bottom surface of a PAA film of FIG. 2A.

A new approach for the use of porous alumina films as a template for nanofabrication is presented. In this process the porous films are prepared on silicon substrates, as an example for a technology-relevant rigid substrate, simplifying both the template fabrication and subsequent processing, and improving the quality of the films and their surfaces Structural analysis of the film was carried out. Porous films without a barrier layer separating the substrate from the pore channel were prepared. The aspect ratio of the channels, i.e. the ratio between its length and its diameter, was controlled between ~10 to ~1000. Therefore, the film is suitable as a template for the growth of nanorods and nanowires. Prior techniques have produced PAA films on substrates having pores with a maximum aspect ratio of ~50 and included a barrier layer. Nanowires of various materials (metals, semiconductors, and polymers) were prepared by pressure injection or electrochemical deposition in alumina films 5-10 μm thick with parallel ordered pores 40 nm in diameter. The films were also patterned by lithography, offering new opportunities for area-selective anodization, anodization of non-planar structures, and area-selective growth of nanowires. The new approach offers a straightforward method for the fabrication of arrays of nanostructures and their incorporation into electronic and optical devices The fabrication of PAA films on a silicon wafer which can be used as templates for providing nanowire arrays involves the following steps and is shown in FIG. 1. While a specific implementation and process is described, it should be appreciated that similar process steps and materials could also be used. Preparation of the substrate 10 is the first step. While the use of silicon is described, other solid materials, such as III-V type materials, oxides, glasses and polymers, may serve as a substrate as long as their electrically conducting surfaces and their chemically reactive surfaces can be isolated from the electrolytes used in the process. This can be achieved by applying a suitable coating on the substrate or by confining the electrolyte. For example, we have used as wafer 10 glass slides, and silicon wafers whose back side was coated with silicon dioxide. The purpose of the substrate or wafer layer 10 is (1) to give mechanical strength to the device structure and (2) to mold the shape and topography of the PAA film. The PAA device may not, in general, be fabricated directly on the surface of the wafer 10. This is because of the mechano-chemical constraints imposed by the process The top surface of the substrate (the surface facing the PAA film) needs to strongly adhere to aluminum and to alumina, and it needs to support the strain associated with the volume expansion of the aluminum layer when it is converted to PAA For this reason previous works dealt only with thin, therefore less strained, PAA films on substrates. These films have too low of an aspect ratio to grow nanowires.

For this reason, additional layers of material 20 may be deposited on the wafer. The purpose of the layers 20, so called adhesion layers, is (1) to serve as an adhesion layer that holds together the stack of layers of the device and relieves structural stress, (2) to permit, in case of a conducting layer, the anodization process to react completely with the entire layer of aluminum, (3) to define the structure and properties of the interface between the bottom end of the channels and the substrate, in particular whether the barrier layer will be removed or will remain in the structure (vide infra), (4) to guide the filling of the pores and the formation of nanowires, for example as working electrodes during electrochemical deposition, and (5) to introduce other functionalities to the device, such as sensing and addressing capabilities. For example, an adhesion layer on a silicon wafer may consist of a film of deposited titanium, or a coating of thermal oxide, or a multi-layer structure ($SiO_2$/Ti/Pt). At this stage conventional patterning techniques can be used to pattern the layers Nevertheless, omitting the use of the adhesion layer can be advantageous. The PAA film may be fabricated directly on wafer 10. When the PAA is grown on a silicon wafer with its back side covered with $SiO_2$ the PAA film will separate from the wafer at the end of the anodization step This is a convenient way to obtain high-quality free-standing PAA films with a surface topography precisely complementary to the topography of the wafer surface For example, atomically flat substrates afford PAA films with extremely flat surfaces, particularly suitable as nanoscale pattern-transfer contact masks.

The next step after the substrate has been prepared involves providing a layer of aluminum 30 on the substrate. This step may be best accomplished by thermal evaporation of aluminum on the substrate. Other methods may include electron beam evaporation, rf-sputtering, electrochemical plating or other means as are known by those of reasonable skill in the art. The layer of aluminum may have a thickness of several hundreds of nanometers to several hundreds of microns. Depending on the method by which the aluminum was provided on the substrate, annealing might be required in order to enlarge the aluminum grain size to the level necessary for the proper formation of uniform pores during the anodization step Electrochemical polish of the aluminum surface is performed next. The surface can be polished by various techniques known by those of reasonable skill in the art. A preferred technique is to expose the aluminum surface to an $H_3PO_4/H_2SO_4/CrO_3$ solution at 85° C. and 20 volts for 1-2 seconds.

The next step comprises anodization of the entire aluminum The conditions for the anodization vary according to the desired feature size. A clear change in the appearance of the film 40 is observed once the aluminum has been completely consumed: As long as aluminum is present, the film has a metallic reflective appearance, while the PAA film itself is transparent Furthermore, features in the current vs time profile can be used to monitor the completion of the anodization.

Three cases need to be considered depending on the nature of the top surface of the adhesion layer 20 (at the interface with the aluminum layer 30). In case I, this layer is a noble metal which in contact with the electrolyte and under the applied potential will generate oxygen gas. The anodization needs to be stopped as the electrolyte reaches the adhesion layer 20 and the current rises, otherwise gas bubbles will rupture the PAA film 40. In case II, this layer is an insulator, and the current will approach zero. There is no critical time for terminating the anodization process. In case III, the adhesion layer 20 is a valve metal or other material that gets slowly oxidized under the anodization conditions, after the anodization of the aluminum layer 30. The most appropriate time to terminate the anodization process needs to be found experimentally depending on the material used and the anodization conditions.

The next step is optional. In some instances it may be desirable to widen the pores of the alumina film 40. This widening of the pores may be accomplished by chemical etching in a solution of $H_3PO_4$.

Depending on the nature of the top surface of the adhesion layer 20, cases I, II and III above, measures may need to be applied to remove the barrier layer 45 at the interface between the PAA film 40 and the adhesion layer 20. In case I (noble metals), the barrier layer 45 is normally missing from the areas where anodization was carried out till completion, so no further treatment is necessary. However, the treatment that will be discussed in the context of case III may be applied nevertheless. In case II (insulators), the conventional undulated thick barrier layer 45 is usually present at the pore ends, and the measures discussed below will not act as to remove it. Therefore insulators should be used under pores that need to remain blocked. In case III (valve metals, etc), it has been observed that an inverted and thinner than usual barrier layer 45 is obtained. This barrier layer 45 is removed by a substrate-assisted localized etching as will be described below.

When the barrier layer 45 is only partially missing it might be necessary to dissolve, etch or remove a thin layer of alumina at the bottom of the pores. The substrate layers are used for the local generation of a chemical agent or a force to rupture the barrier layer 45 without inflicting damage on the rest of the alumina film. For example, cathodic polarization of an adhesion film 20 made of titanium in a potassium chloride solution is used to generate hydrogen gas bubbles and hydroxide ions in the voids under the inverted barrier layer 45.

The resulting film 40 can be used as a template for the fabrication of nanowires 50. The nanowire material is formed into the pores of the array. Methods for filling the pores include, but are not limited to, electrochemical deposition, chemical vapor deposition, pressure injection of a liquid, and impregnation.

This method enables the fabrication of thick (several microns) PAA films on substrates other than aluminum. This technique offers a unique, facile, and versatile approach for the incorporation of anodic alumina films or arrays of nanowires 50 into a variety of environments and devices.

As an alternative, the adhesion layers may be deposited on a thick aluminum film and then a wafer may be deposited or otherwise attached to the adhesion layers.

In a particular example, the results of which are shown in FIGS. 2-7, thick aluminum films (6-12 μm) were obtained by thermal evaporation of Al (Plasmaterials, 99.999%) on n-type silicon substrates (Wafernet, 1-10 Ωcm) in a custom-built chamber (base pressure: $10^{-6}$ torr). Ti and $SiO_2$ films were obtained by sputtering (Applied Materials Endura System) Ti and Pt films were obtained by electron-beam evaporation.

Electrochemical polishing of the films was carried out in an $H_3PO_4\backslash H_2SO_4\backslash CrO_3$ solution at 85° C. and 20 volts The anodization was carried out at constant voltage (50V) in an oxalic acid solution (4 wt %) at 18° C. In both processes a Pt sheet was used as a counter electrode. The resulting alumina film was etched away in an $H_3PO_4\backslash CrO_3$ solution for 16 hours, and the remaining aluminum was reanodized under the same conditions until the metal film was fully oxidized Subsequently the alumina film was dipped for 30 minutes in 5% $H_3PO_4$ The alumina at the bottom of the pores was thinned and removed by applying a negative bias (2 25 V) to the template in a 2-electrode cell with a 0.1M KCl solution for 20 minutes.

The $Bi_2Te_3$ nanowires were fabricated by electrodeposition from a solution of bismuth and tellurium (7 mM and 10 mM, respectively) in 1 M nitric acid in a 3-electrode cell at −10 mV vs. a saturated calomel electrode (SCE) using a PAR Model 273 potentiostat The bismuth nanowires were fabricated by the pressure injection technique or by electrochemical deposition from an aqueous solution of 40 mM bismuth nitrate and 76 mM ethylenediaminetetraacetic acid (EDTA) at −650 mV vs. SCE.

Scanning electron microscopy (JEOL 6320FV) and atomic force microscopy (Digital Instruments Nanoscope IIIa, tapping mode) were employed for the structural analysis of the alumina films.

The PAA film was fabricated in accordance with the process previously described with respect to FIG. 1. The aluminum film was thermally evaporated on a silicon wafer, its back side covered with a silicon oxide layer and its front side coated with a titanium layer. The film was electrochemically polished in a phosphoric acid—sulfuric acid—chromium oxide solution. The porous oxide was formed by anodization in an oxalic acid bath. A prominent change in the appearance of the film and a drop in the current indicated when the aluminum film had been completely oxidized. In order to selectively etch the side of the membrane in contact with the wafer and remove the thin oxide at the end of the pores, the wafer was held under negative bias in an aqueous potassium chloride bath. This process resulted in a high quality PAA film over the full area of the wafer, that was used for further processing, for example: patterning, etching and deposition. In contrast to the conventional PAA films, the films on the silicon substrates can be obtained without an insulating barrier layer at the bottom of the pores, they are very easy to handle due to the mechanical strength of the substrate, and they are suitable for incorporation into larger architectures and devices in the wafer.

It was found that the adhesion of the PAA film to the wafer could be controlled by the predeposition of other materials on the wafer. When the aluminum was evaporated on a bare silicon wafer, the alumina detached from the substrate as the anodization endpoint was reached If a titanium layer was sputtered on the substrate before the aluminum film, the alumina adhered permanently to the substrate Since free standing PAA films can be obtained if no adhesion layer is used, both faces of the PAA film can be analyzed.

Referring now to FIGS. 2A and 2B SEM images of the top side (facing the solution) and the bottom side (facing the wafer) of the PAA film 40 is shown. These images show that the porous structure is continuous through the membrane 40 with a noticeable hexagonal pattern, and that the barrier layer is missing. The AFM images of the surfaces shown in FIGS. 2C and 2D show a striking difference between the faces: the bottom side of the film 40 is inherently flat, mirroring the smoothness of the silicon surface, while the top side of the PAA film 40 shows the typical roughness associated with the effects of the etch solutions The flat surface of the PAA film improves its performance as a contact mask for pattern-transfer, compared to PAA films made by other methods, increasing the fidelity of the pattern-transfer process.

Figure 3:
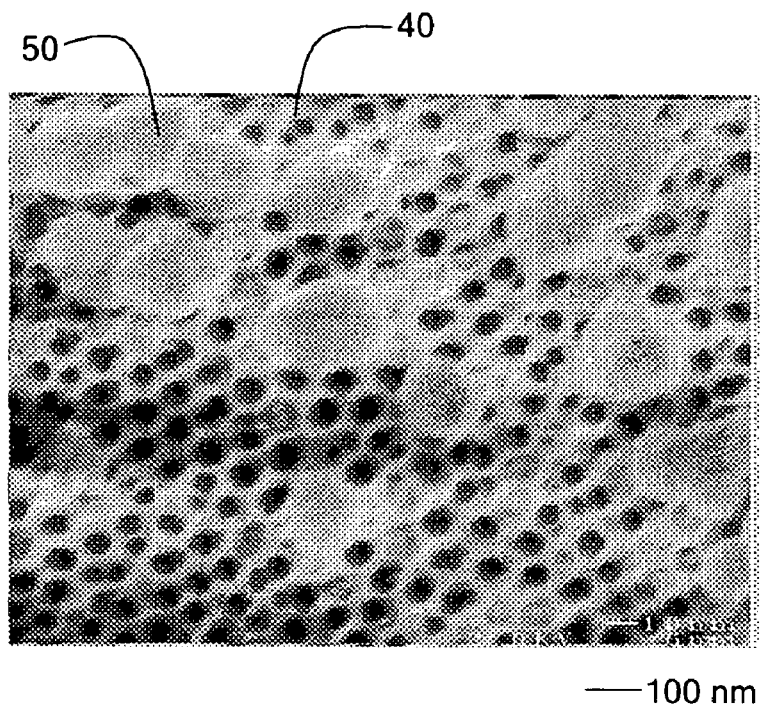
FIG. 3 is a SEM image showing the presence of nanowires within the template.

The alumina-on-silicon system was considered as a template for the fabrication of nanowires Two methods of pore filling and two materials of relevance to thermoelectric applications were employed The first method and material comprised bismuth nanowires, 40 nm in diameter, were prepared by a pressure injection technique. By stripping the filled alumina from the substrate, it was verified through SEM imaging that the nanowires are continuous, sticking out of both ends of the channels. FIG. 3 shows the bottom (wafer) side of the porous template 40, partly filled with bismuth nanowires 50 (bright spots in the channels).

Figure 4:
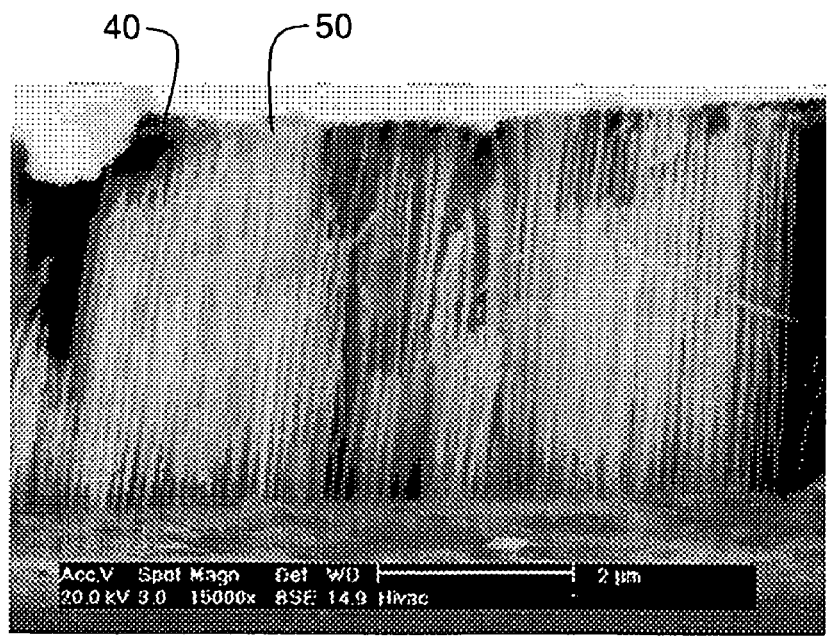
FIG. 4 is a cross-sectional view of a PAA template filled with nanowires.

The second method and material comprised $Bi_2Te_3$ nanowires prepared by electrochemical deposition from a nitric acid solution. The titanium layer under the oxide film served as the working electrode from which the nanowires began growing. FIG. 4 shows a cross section of a bismuth telluride filled template 40. A high filling factor of continuous nanowires 50 (bright sticks) is observed These two examples demonstrate the accessibility of the pores from either end, despite the fact that the membrane is attached to a substrate. The pores can be filled either by depositing material from the bottom ends (wafer side) up as in the electrochemical deposition, or by inserting material from the top ends (solution side) into the pores. In the same fashion, the obtained nanowires can be contacted physically, mechanically, electrically, thermally and possibly optically from both ends The resulting nanochannel arrays and nanowire arrays can thus be incorporated into electronic and optical devices on the wafer and be further utilized in nano-scale and micro-scale patterning. When a patterned conductor layer is used under the PAA film, it is possible to provide different types of nanowires on different areas within the same template.

Figure 5:
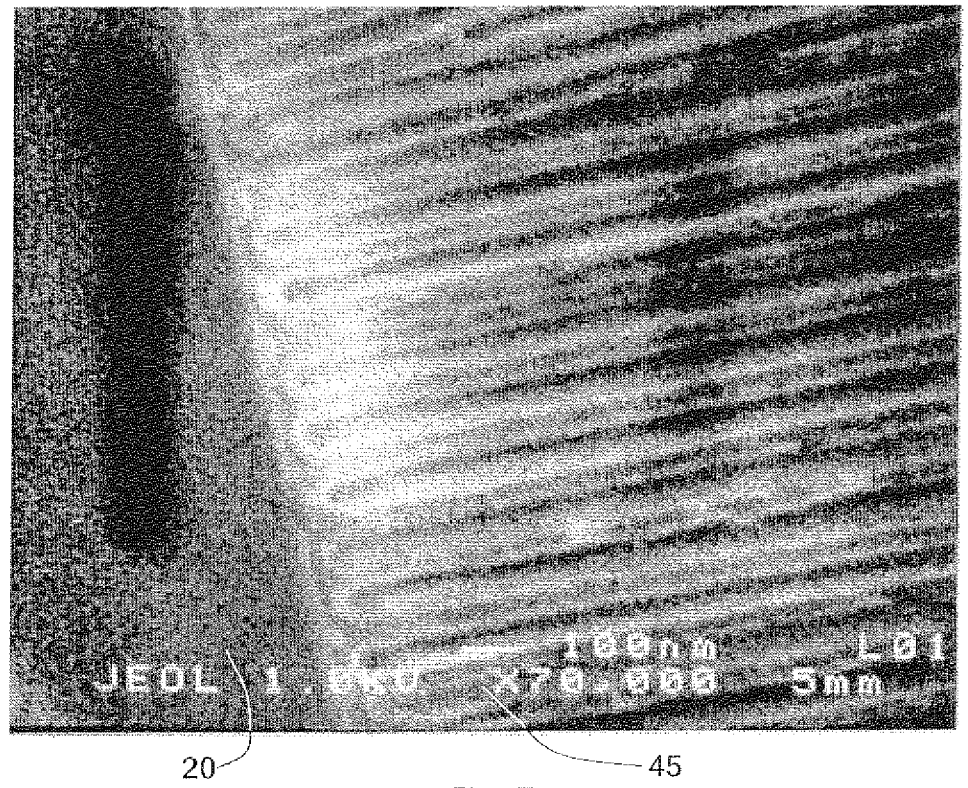
FIG. 5 is a cross-sectional view of the interface between the barrier layer and a silicon oxide adhesion layer.

In another example, the silicon wafer was thermally oxidized. Aluminum was deposited on the wafer, electrochemically polished, and anodized as described in the previous example. The anodization was continued till the current value reached 0.01% of the maximum anodization current. FIG. 5 shows a cross section of the interface between the scalloped alumina barrier layer 45 and the silicon dioxide layer 20. This thick barrier layer 45 is resistant to the localized etching process described above.

Figure 6:
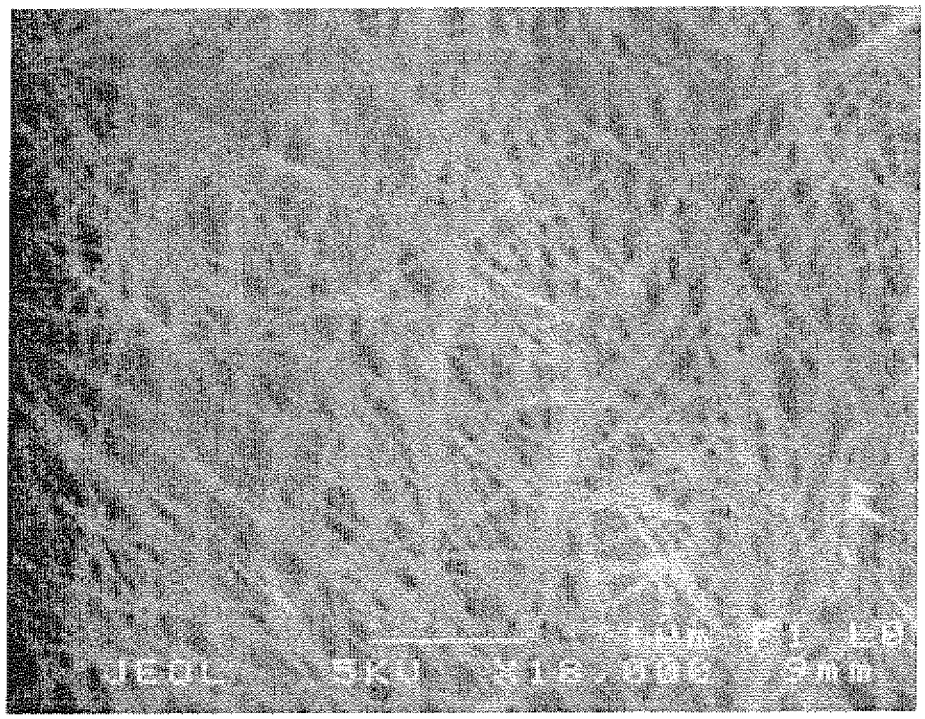
FIG. 6 is an image of nanowires attached to a substrate after the removal of the template.
Figure 7:
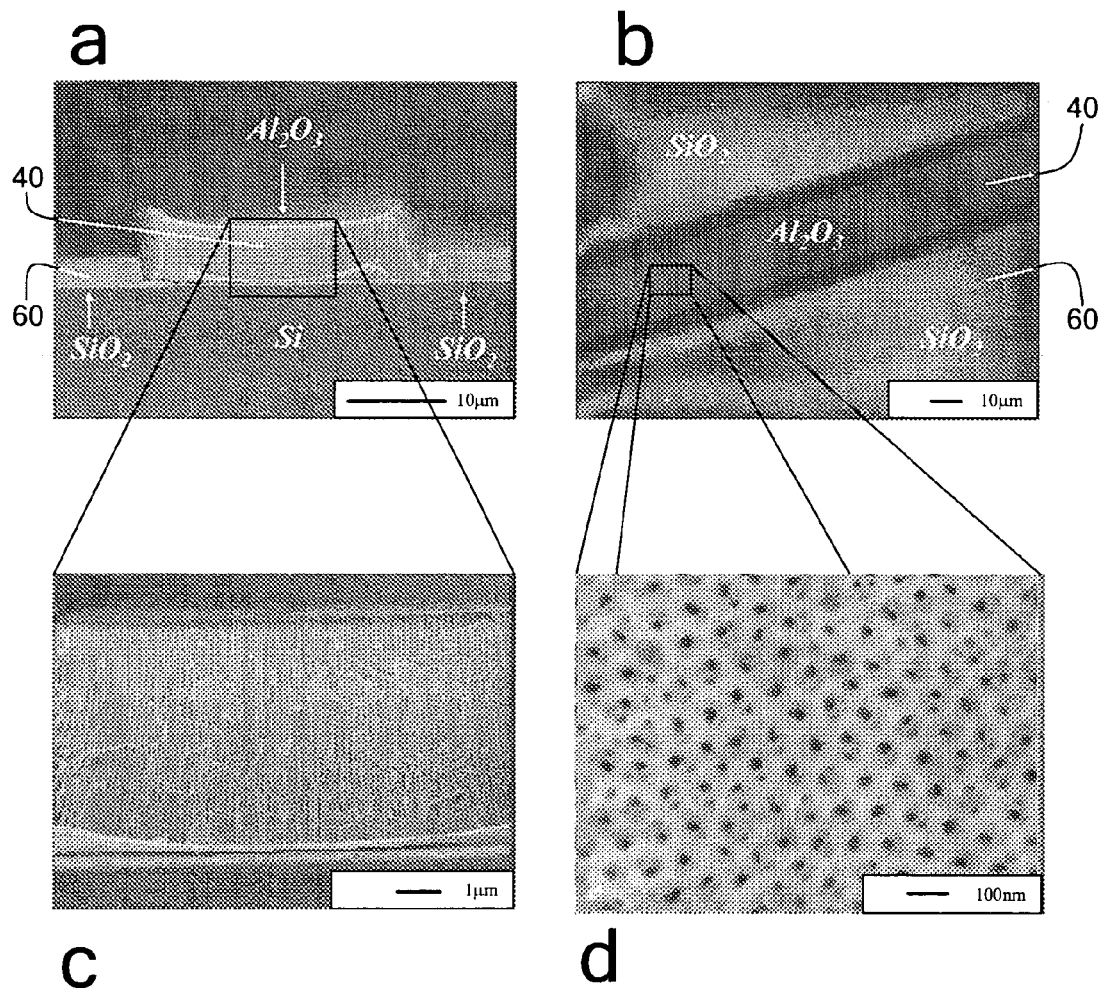
FIG. 7A is a side view SEM image of a PAA film grown in a trench between two pieces of other material.
FIG. 7B is a top view SEM image of the PAA film grown in a trench between two pieces of other material.
FIG. 7C is a magnified view of a portion of FIG. 7A.
FIG. 7D is a magnified view of a portion of FIG. 7B.
Figure 8A:
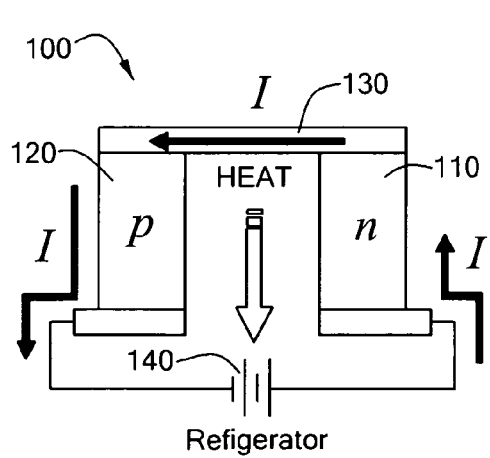
FIG. 8A is a diagram of a thermoelectric element arranged as a cooling device.

In another example, the silicon wafer was thermally oxidized. Electron-beam evaporation was used to deposit a titanium layer followed by a platinum layer on the front side of the wafer Aluminum was deposited on the wafer, electrochemically polished, and anodized as described in the previous examples The anodization was carried out until a surge in current was observed. No further steps were necessary to remove the barrier layer. Bismuth nanowires were electrochemically deposited in the pores from an aqueous solution of bismuth nitrate and EDTA. FIG. 6 shows the bismuth nanowires attached to the platinum film on the surface of the wafer after the alumina was etched away The presently disclosed method provides the ability to pattern the PAA film by the fabrication of a series of bars of alumina in between slabs of silicon oxide predeposited on the wafer. FIGS. 7A-7D show an example of a 25 μm wide, 5 μm thick, and 1500 μm long PAA strip 40 obtained by the anodization of an aluminum bar between bars of silicon oxide 60. It is interesting to notice the lateral growth of pores from the sidewalls in addition to the vertical growth of pores from the top surface The different growth rates lead to the curved shape observed in the cross section view of FIG. 7A. Clearly, the anodization of non-planar features displays an additional complexity, which could be exploited to obtain a new variety of structures Referring now to FIGS. 8A-B, thermoelectric devices 100 and 101 are shown schematically. The thermoelectric device 100 is arranged to operate as a cooling device. The devices include a leg of n-type material 110, a leg of p-type material 120 and a junction 130 interconnecting the n-type leg 110 with the p-type leg 120. Device 100 further comprises a voltage source 140 coupled across the n-type leg 110 and p-type leg 120. This arrangement results in current flowing from the n-type leg, across junction 130 and through p-type leg 120. Whenever electrical current flows through two dissimilar materials, depending on the direction of current flow through the materials, the junction of the p-type and n-type material will either absorb or release heat When the thermoelectric device 100 is connected to a voltage source 140 such that the n-type leg 110 is connected to the positive lead of the voltage source and the p-type leg 120 is connected to the negative lead of the voltage source, the following phenomenon occurs. Charge carriers, also known as electrons, in the n-type material are repelled by the negative potential and attracted to the positive potential of the voltage source. Similarly, the positive charge carriers, also known as holes, in the p-type material are repelled by the positive voltage potential and attracted by the negative potential of the voltage source. The charge carriers are carrying heat away from the junction 130 connecting the p-type and n-type material, thus the device is providing a cooling function at the junction connecting the p-type and n-type materials Conversely, when the thermoelectric device 100 is connected to a voltage source such that the p-type leg is connected to the positive lead of the voltage source and the n-type leg is connected to the negative lead of the voltage source the opposite effect takes place. The negative charge carriers (electrons) in the n-type material are repelled by the negative potential and attracted to the positive potential of the voltage source Similarly, the positive charge carriers (holes) in the p-type material are repelled by the positive voltage potential and attracted by the negative potential of the voltage source. The charge carriers are carrying heat to the junction of the p-type and n-type material, thus the device is providing a heating function at the junction of the n-type and p-type materials.

Figure 8B:
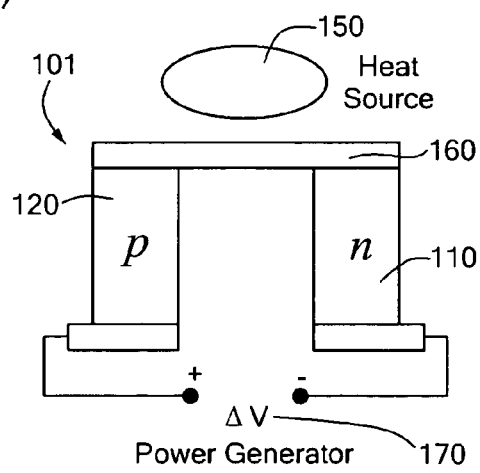
FIG. 8B is a diagram of a thermoelectric element arranged as a power generating device.

Referring now to FIG. 8B, when a heat source is brought into proximity with junction 160 of device 101, a voltage differential is provided across p-type leg 120 and n-type leg 110. In the n-type side of the deice 101, the heat causes negative charge to flow from the junction 160 to the colder end of the n-type leg 110 of the thermoelectric device. In the p-type side of the device 101, the heat is causing positive charge to flow from the junction region to the colder end of the p-type leg 120. In this configuration, the thermoelectric device is converting heat to electrical energy, thus functioning as a power generator.

A device comprising a thermoelectric element formed from nanowire arrays and the process for making such a device is shown in FIGS. 9A-9D. As shown in FIG. 9A, a silicon substrate 210 is provided as the support for the device. A pair of electrodes 230 is patterned on the silicon substrate 210. A porous anodic alumina film 220 is provided on the electrodes 230 and substrate 210. The process for providing such a porous anodic alumina film 220 has been described in detail above.

Referring now to FIGS. 9B and 9C, a plurality of p-type nanowires 222 are provided in the film 220 over one of the electrodes 230, and as shown in FIG. 9C a plurality of n-type nanowires 224 are provided in the film 220 over the other electrode 230.

As shown in FIG. 9D a junction 260 is deposited on the top surface of the film 220. Junction 260 provides an electrical path and a thermal path between the n-type nanowires 222 and the p-type nanowires 224. The resulting device can perform as a cooling device, similar to the thermoelectric device shown in FIG. 8A when a voltage source is provided across the electrodes 230. The thermoelectric device can also function as a power generator when a heat source is provided to junction 260.

Figure 10:
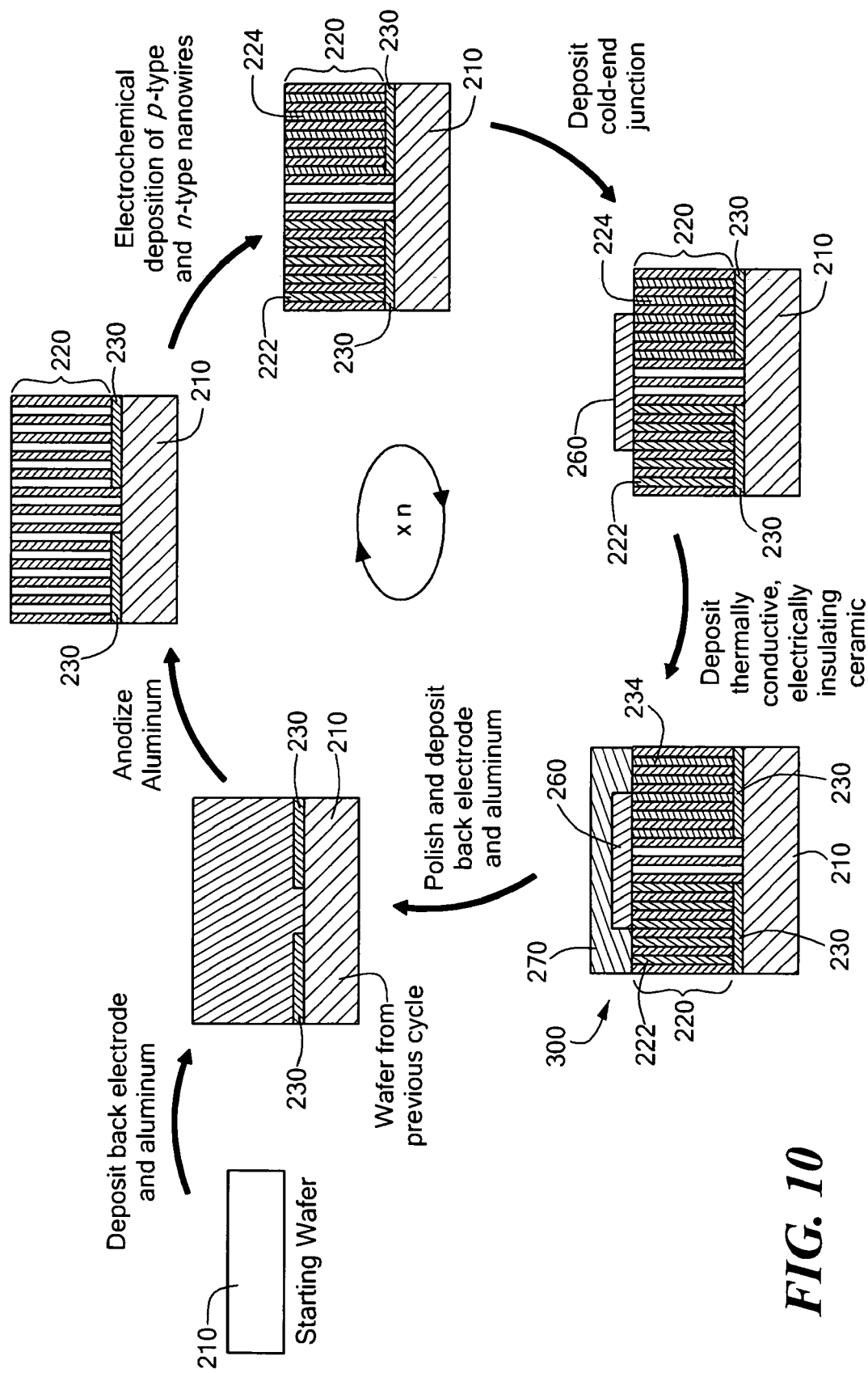
FIG. 10 is a diagram of the steps in the assembly of a multi-component, multi-stage thermoelectric device.
Figure 11:
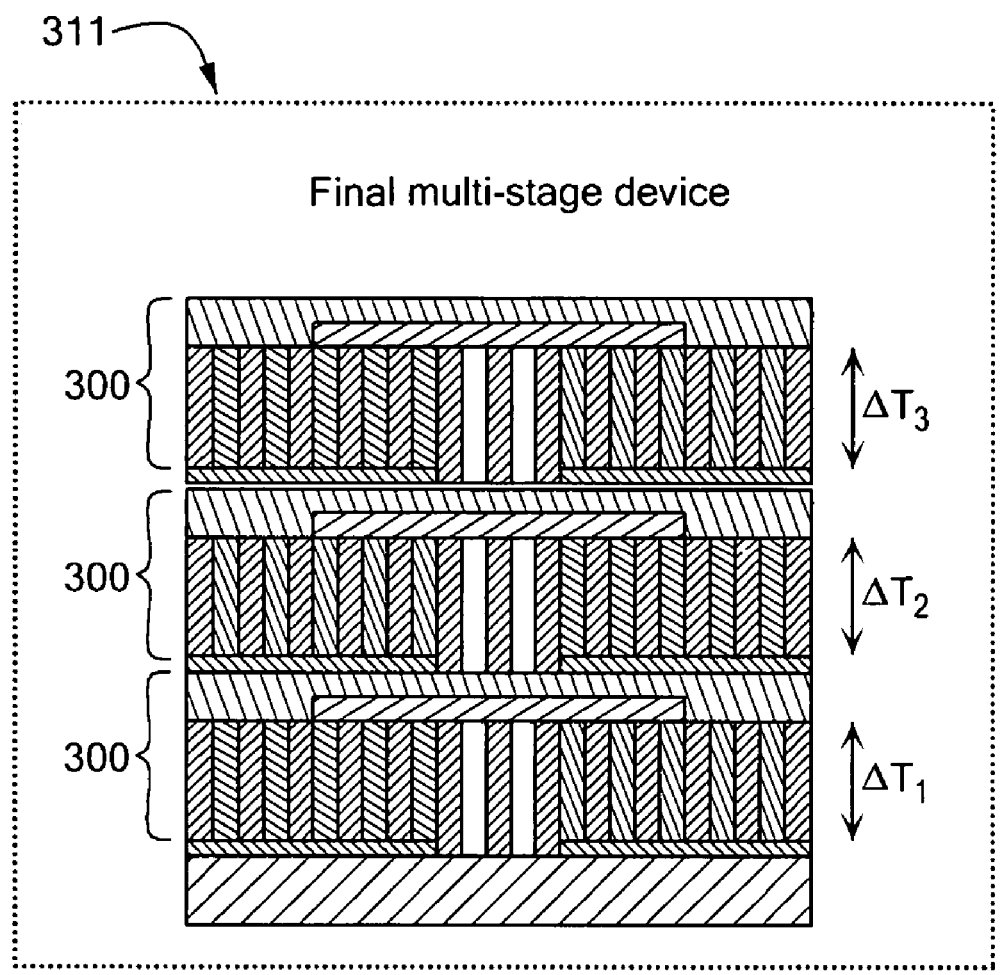
FIG. 11 is a diagram of a multistage nanowire-based thermoelectric device.

Referring now to FIGS. 10 and 11, a multi-stage nanowire-based thermoelectric device is shown. A single stage 300 of the device is the same as the device described above with respect to FIGS. 9A-9D. However, in order to turn the single thermoelectric device into a multistage thermoelectric device, additional steps are required. As shown in FIG. 10, once a single nanowire based thermoelectric device 300 is produced, a thermally conducting electrically insulating material 270 (such as a ceramic) is deposited over the junction 260. This material extends over the junction 260 and also over the array of p-type nanowires and over the array of n-type nanowires. Another device 300 is provided on top of the material 270 of the first device, using material 270 as a base support. This process is repeated any desired number of times resulting in a multi-stage nanowire based thermoelectric device, 310 as shown in FIG. 11. These devices 310 generate a larger temperature gradient than single stage devices 300.

As described above, high quality porous alumina membranes are fabricated on silicon substrates by a novel process Improvements in terms of the effective area of the films and the flatness of the surfaces resulted from the new process. The films may be formed lacking the insulating barrier layer, making the pores accessible from both ends. The adhesion of the porous alumina to the substrate can be modified by intermediate layers, making it possible to obtain both free standing films and films strongly held to the wafer. The films were used as templates for the growth of bismuth and bismuth telluride nanowires. Silicon processing techniques were used for the area-selective growth and patterning of the porous films. In summary, this new approach simplifies the preparation of the porous oxide and allows much more flexibility in the processing of the film, making porous alumina a convenient and versatile tool for the assembly of devices based on nanostructures. Single stage and multistage nanowire-based thermoelectric devices are produced using the present process.

Having described preferred embodiments of the invention it will now become apparent to those of ordinary skill in the art that other embodiments incorporating these concepts may be used Accordingly, it is submitted that the invention should not be limited to the described embodiments but rather should be limited only by the spirit and scope of the appended claims All publications and references cited herein are expressly incorporated herein by reference in their entirety

What is claimed is:

1. A device comprising:
   a non-aluminum substrate;
   an adhesion layer disposed over the non-aluminum substrate, wherein said adhesion layer consists essentially of a multi-layer structure of $SiO_2$/Ti/Pt; and
   a porous anodic alumina template formed on the adhesion layer of said substrate.

2. The device of claim 1 further comprising a plurality of nanowires formed within said template.

3. The device of claim 2 further comprising a layer of material deposited on a top surface of said template.

4. The device of claim 3 further comprising patterning said layer deposited on a top surface of said template.

5. The device of claim 3 wherein at least some of said nanowires are connected to said layer of material deposited on a top surface of said template.

6. The device of claim 3 wherein at least some of said nanowires are connected to said substrate and to said layer of material deposited on a top surface of said template.

7. The device of claim 3 wherein none of said nanowires is connected to said substrate and none of said nanowires is connected to said layer of material deposited on a top surface of said template.

8. The device of claim 2 wherein said plurality of nanowires is formed by filling pores of said template with nanowire material.

9. The device of claim 8 wherein said nanowire material is selected from the group including: metals, semiconductors, oxides, polymers and layers of at least two of said metals, semiconductors, oxides and polymers arranged along at least one of a radial dimension and an axial dimension.

10. The device of claim 2 wherein at least some of said nanowires are connected to said substrate.

11. The device of claim 2 wherein said plurality of nanowires comprises a first set of nanowires of a first material and at least one more set of nanowires of at least one other material.

12. The device of claim 11 wherein said first material is provided as a first semi-conductor material doped to a predetermined dopant level by introduction of an n-type dopant material into said first material.

13. The device of claim 11 wherein said at least one other material is provided as a second semi-conductor material doped to a predetermined dopant level by introduction of a p-type dopant material into said at least one other material.

14. The device of claim 1 wherein said substrate is selected from the group including: a silicon wafer, an oxidized silicon wafer, and a glass slide.

15. The device of claim 1 wherein said substrate comprises a non-planar substrate.

16. The device of claim 1 wherein said template is formed without a barrier layer.

17. The device of claim 1 wherein said template is formed with a barrier layer, and said barrier layer is at least partially removed by a process that does not substantially change any other component of said device.

18. The device of claim 17 wherein said process is one of electrochemical generation of gas between said barrier layer and said substrate, and electrochemical generation of an alumina etchant in the proximity of said barrier layer.

19. The device of claim 1 wherein said template has a thickness between 50 nm and 500 microns.

20. The device of claim 1 wherein said template has pores of approximately cylindrical shape; and the ratio of the length of said pores to the diameter of said pores is between 1 and 2500.

21. The device of claim 1 wherein said template is processed.

22. The device of claim 1 wherein said template has widened pores with diameters larger than the diameters of the pores obtained by anodization without further processing.

23. The device of claim 1 wherein said template is patterned to obtain a shaped template differing in shape from the template obtained by anodization without further processing.

24. The device of claim 1 wherein all surface areas of said template, excluding the pore openings, are provided having a surface with a root-mean-square surface roughness of approximately 5.5 Angstrom.

25. The device of claim 1 wherein said substrate further comprises a conductive layer disposed on at least a portion of said substrate.

26. The device of claim 25 wherein said conductive layer comprises a material that oxidizes at a relatively slow rate under anodization conditions.

27. The device of claim 25 wherein said conductive layer comprises a layer of a noble metal film atop other films.

28. The device of claim 25 wherein said conductive layer is patterned.

29. The device of claim 25 wherein said template includes a plurality of pores in which a first group of said plurality of pores terminates at a barrier layer over said substrate and a second group of said plurality of pores is open over said conductive layer.

30. The device of claim 1 further comprising:
a barrier layer disposed at an interface between said porous anodic alumina (PAA) template and a top surface of said adhesion layer.

31. The device of claim 1 wherein said substrate comprises a rigid material suitable for processing.

32. The device of claim 1 further comprising a layer of material deposited on said substrate.

33. The device of claim 32 wherein said layer of material is at least one of the group including layers of adhesion promoting materials, layers with electrically conducting surfaces, and layers with electrically insulating surfaces.

34. The device of claim 32 wherein said layer of material is patterned.

35. A device comprising:
a wafer;
an adhesion layer provided on a top surface of said wafer, said adhesion layer consisting essential of a multi-layer structure of $SiO_2$/Ti/Pt;
a porous anodic alumina film disposed on said adhesion layer; and
a plurality of nanowires disposed in said porous anodic alumina film.

36. The device of claim 35 further comprising of at least one layer disposed on top of said porous anodic alumina film.

37. The device of claim 36 wherein at least one of said nanowires is connected to said at least one layer.

38. The device of claim 36 wherein at least one of said nanowires is connected to said adhesion layer and to said at least one layer.

39. The device of claim 36 wherein none of said nanowires is connected to said adhesion layer and none of said nanowires is connected to said at least one layer.

40. The device of claim 36 wherein at least one of said nanowires and vacant pores of said porous anodic alumina film are addressable by at least one of said adhesion layer and said at least one layer.

41. The device of claim 35 wherein at least one of said nanowires is connected to said adhesion layer.

42. The device of claim 35 wherein said plurality of nanowires comprises a first set of nanowires of a first material and at least one more set of nanowires of at least one other material.

43. A multistage device comprising:
a first stage comprising:
a wafer;
a first adhesion layer provided on a top surface of said wafer, said adhesion layer consisting essentially of a multi-layer structure of $SiO_2$Ti/Pt;
a porous anodic alumina film disposed on said first adhesion layer;
a first plurality of nanowires disposed in said porous anodic alumina film; and
at least one layer disposed on top of said porous anodic alumina film; and
at least one additional stage, each of said at least one additional stage comprising:
a second adhesion layer provided on a top surface of a previous stage;

a second porous anodic alumina film disposed on said second adhesion layer;

a second plurality of nanowires disposed in said second porous anodic alumina film; and at least one second layer disposed on top of said second porous anodic alumina film.

44. The device of claim 43 wherein at least one of said first and second plurality of nanowires is connected to one of said first and second adhesion layer.

45. The device of claim 43 wherein at least one of said first and second plurality nanowires is connected to one of said at least one layer and said at least one second layer.

46. The device of claim 43 wherein at least one of said first and second plurality of nanowires is connected to one of said first and second adhesion layer and to one of said at least one layer and said at least one second layer.

47. The device of claim 43 wherein none of said first and second plurality of nanowires is connected to said first adhesion layer, said second adhesion layer, said at least one layer and said at least one second layer.

48. The device of claim 43 wherein at least one of said nanowires and vacant pores of said porous anodic alumina film are addressable by at least one of said first adhesion layer, said second adhesion layer, said at least one layer and said at least one second layer.

49. The device of claim 43 wherein at least one of said first and second plurality of nanowires comprises a first set of nanowires of a first material and at least one more set of nanowires of at least one other material.

* * * * *

UNITED STATES PATENT AND TRADEMARK OFFICE
CERTIFICATE OF CORRECTION

PATENT NO. : 7,267,859 B1
APPLICATION NO. : 10/303653
DATED : September 11, 2007
INVENTOR(S) : Oded Rabin et al.

It is certified that error appears in the above-identified patent and that said Letters Patent is hereby corrected as shown below:

Abstract, line 11 delete "surfaces PAA" and replace with --surfaces. PAA--.

Abstract, line 13 delete "conditions the" and replace with --conditions, the--.

Column 1, line 53 delete "being" and replace with --been--.

Column 2, line 20 delete "steps the" and replace with --steps, the--.

Column 2, line 42 delete "film" and replace with --films--.

Column 2, line 61 delete "conditions the" and replace with --conditions, the--.

Column 4, line 5 delete "process the" and replace with --process, the--.

Column 4, line 27 delete "devices" and replace with --devices.--.

Column 4, line 48 delete "process The" and replace with --process. The--.

Column 4, line 52 delete "PAA for" and replace with --PAA. For--.

Column 4, line 52 delete "reason previous" and replace with --reason, previous--.

Column 5, line 6 delete "stage conventional" and replace with --stage, conventional--.

Column 5, line 7 delete "layers" and replace with --layers.--.

Column 5, line 11 delete "Si $O_z$ the" and replace with --Si $O_z$, the--.

Column 5, line 15 delete "surface For" and replace with --surface. For--.

Column 5, line 31 delete "step" and replace with --step--.

Column 5, lines 38-39 delete "aluminum The" and replace with --aluminum. The--.

Column 5, line 44 delete "transparent Furthermore," and replace with --transparent. Furthermore,--.

Column 5, line 44 delete "vs" and replace with --vs.--.

Column 6, line 18 delete "missing it" and replace with --missing, it--.

UNITED STATES PATENT AND TRADEMARK OFFICE
CERTIFICATE OF CORRECTION

| | | |
|---|---|---|
| PATENT NO. | : 7,267,859 B1 | |
| APPLICATION NO. | : 10/303653 | |
| DATED | : September 11, 2007 | |
| INVENTOR(S) | : Oded Rabin et al. | |

It is certified that error appears in the above-identified patent and that said Letters Patent is hereby corrected as shown below:

Column 6, line 48 delete "system) Ti" and replace with --system). Ti--.

Column 6, line 51 delete "volts The" and replace with --volts. The--.

Column 6, line 53 delete "processes a" and replace with --processes, a--.

Column 6, line 58 delete "oxidized Subsequently" and replace with --oxidized. Subsequently--.

Column 6, line 59 delete "$H_3 PO_4$ The" and replace with --$H_3 PO_4$. The--.

Column 6, lines 60-61 delete "(225 V)" and replace with --(2.25 V)--.

Column 6, line 67 delete "potentiostat The" and replace with --potentiostat. The--.

Column 7, line 35 delete "reached If" and replace with --reached. If--.

Column 7, line 37 delete "substrate Since" and replace with --substrate. Since--.

Column 7, line 40 delete "2B SEM" and replace with --2B, SEM--.

Column 7, line 50 delete "solutions The" and replace with --solutions. The--.

Column 7, line 56 delete "nanowires Two" and replace with --nanowires. Two--.

Column 7, line 58 delete "employed The" and replace with --employed. The--.

Column 8, line 5 delete "observed" and replace with --observed.--.

Column 8, line 14 delete "ends The" and replace with --ends. The--.

Column 8, line 33 delete "wafer Aluminum" and replace with --wafer. Aluminum--.

Column 8, line 35 delete "examples The" and replace with --examples. The--.

Column 8, line 41 delete "away" and replace with --away.--.

Column 8, line 50 delete "surface The" and replace with --surface. The--.

Column 8, line 54 delete "structures" and replace with --structures.--.

UNITED STATES PATENT AND TRADEMARK OFFICE
CERTIFICATE OF CORRECTION

PATENT NO.       : 7,267,859 B1
APPLICATION NO.  : 10/303653
DATED            : September 11, 2007
INVENTOR(S)      : Oded Rabin et al.

It is certified that error appears in the above-identified patent and that said Letters Patent is hereby corrected as shown below:

Column 8, line 67 delete "heat When" and replace with --heat. When--.

Column 9, line 20 delete "source the" and replace with --source, the--.

Column 9, line 23 delete "source Similarly," and replace with --source. Similarly,--.

Column 9, line 27 delete "material," and replace with --materials,--.

Column 9, line 33 delete "deice 101," and replace with --device 101,--.

Column 9, line 52 delete "FIG. 9C a" and replace with --FIG. 9C, a--.

Column 9, line 55 delete "FIG. 9D a" and replace with --FIG. 9D, a--.

Column 10, line 15 delete "process" and replace with --process.--.

Column 10, lines 34-35 delete "invention it" and replace with --invention, it--.

Column 10, line 37 delete "used Accordingly" and replace with --used. Accordingly,--.

Column 10, line 40 delete "claims All" and replace with --claims. All--.

Column 10, line 42 delete "entirety" and replace with --entirety.--.

Column 12, line 25 delete "essential" and replace with --essentially--.

Signed and Sealed this

Eleventh Day of December, 2007

JON W. DUDAS
*Director of the United States Patent and Trademark Office*